US012807905B2

(12) United States Patent
Wada et al.

(10) Patent No.: US 12,807,905 B2
(45) **Date of Patent: *Nov. 24, 2026**

(54) CLEANING LIQUID AND METHOD FOR CLEANING SUBSTRATE

(71) Applicant: TOKYO OHKA KOGYO CO., LTD., Kawasaki (JP)

(72) Inventors: Yukihisa Wada, Kawasaki (JP); Jun Kondo, Kawasaki (JP); Choitsu Go, Kawasaki (JP); Kohei Serizawa, Kawasaki (JP); Kazumasa Wakiya, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 610 days.

This patent is subject to a terminal disclaimer.

(21) Appl. No.: 18/061,606

(22) Filed: Dec. 5, 2022

(65) Prior Publication Data

US 2023/0203408 A1 Jun. 29, 2023

(30) Foreign Application Priority Data

Dec. 28, 2021 (JP) ................................ 2021-214870

(51) Int. Cl.
*C11D 3/26* (2006.01)
*C11D 1/00* (2006.01)
(Continued)

(52) U.S. Cl.
CPC .............. *C11D 7/3218* (2013.01); *C11D 1/00* (2013.01); *C11D 3/0073* (2013.01); *C11D 3/044* (2013.01);
(Continued)

(58) Field of Classification Search
CPC ......... C11D 1/00; C11D 3/0073; C11D 3/044; C11D 3/28; C11D 3/30; C11D 7/3218; C11D 7/3209
(Continued)

(56) References Cited

U.S. PATENT DOCUMENTS 4,968,398 A 11/1990 Ogasawara
5,846,695 A 12/1998 Iwata
(Continued)

FOREIGN PATENT DOCUMENTS

CN 111381459 A 7/2020
EP 578507 A2 * 1/1994 ............... B08B 3/08
(Continued)

OTHER PUBLICATIONS

Office Action issued in U.S. Appl. No. 18/061,617, dated Apr. 10, 2025, in 11 pages.

*Primary Examiner* — Gregory R Delcotto
(74) *Attorney, Agent, or Firm* — Knobbe, Martens, Olson & Bear, LLP

(57) ABSTRACT

A cleaning liquid for cleaning a substrate in which at least one of molybdenum and tungsten is exposed on a surface, in which the cleaning liquid includes at least one of a compound represented by General Formula (a1), a hydrate of the compound, and a salt of the compound, a water-soluble basic compound with a pH of 9.5 or more in a 0.1 M aqueous solution, which is measured at 23° C. with a pH meter, and water. In General Formula (a1), $R^1$ and $R^2$ each independently represents an organic group including no carbonyl group or a hydrogen atom
(Continued)

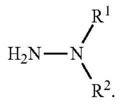

(a1)

8 Claims, 1 Drawing Sheet

(51) Int. Cl.

| | |
|---|---|
| ***C11D 3/00*** | (2006.01) |
| ***C11D 3/04*** | (2006.01) |
| ***C11D 3/20*** | (2006.01) |
| ***C11D 3/28*** | (2006.01) |
| ***C11D 3/30*** | (2006.01) |
| ***C11D 7/08*** | (2006.01) |
| ***C11D 7/32*** | (2006.01) |
| ***C11D 7/36*** | (2006.01) |
| ***C11D 7/50*** | (2006.01) |
| ***H10P 70/00*** | (2026.01) |

(52) U.S. Cl.

CPC .............. *C11D 3/2068* (2013.01); *C11D 3/28* (2013.01); *C11D 3/30* (2013.01); *C11D 7/08* (2013.01); *C11D 7/3209* (2013.01); *C11D 7/36* (2013.01); *C11D 7/5013* (2013.01); *C11D 7/5022* (2013.01); *H10P 70/273* (2026.01); *H10P 70/277* (2026.01); *C11D 2111/22* (2024.01)

(58) Field of Classification Search

USPC ........ 510/175, 176, 178, 499, 504, 505, 506

See application file for complete search history.

(56) References Cited

U.S. PATENT DOCUMENTS 5,981,454 A 11/1999 Small
6,103,680 A * 8/2000 Honda .............. H01L 21/02071 134/1.1
6,326,130 B1 * 12/2001 Schwartzkopf ......... G03F 7/425 430/256
6,440,326 B1 8/2002 Maruyama
6,546,939 B1 * 4/2003 Small ................... C11D 3/2086 438/692
6,585,825 B1 7/2003 Skee
7,951,765 B2 * 5/2011 Kim ........................ G03F 7/426 510/176
2002/0077259 A1 6/2002 Skee
2003/0083215 A1 5/2003 Lee et al.
2005/0202987 A1 9/2005 Small et al.
2006/0008925 A1 1/2006 Takashima
2006/0040838 A1 2/2006 Shimada
2008/0004197 A1 1/2008 Kneer
2009/0082240 A1 3/2009 Nukui et al.
2009/0140202 A1 6/2009 Takahashi
2010/0152086 A1 6/2010 Wu et al.
2012/0048295 A1 * 3/2012 Du .................... H01L 21/02071 134/3
2012/0129345 A1 * 5/2012 Lee ...................... C11D 3/0047 438/692
2012/0157368 A1 * 6/2012 Mizuta .................... G03F 7/426 510/176
2013/0225464 A1 * 8/2013 Harada .................. C11D 1/008 510/175
2014/0264151 A1 9/2014 Ko
2014/0318584 A1 10/2014 Cooper
2016/0179011 A1 * 6/2016 Agarwal ................ C11D 7/267 510/176
2016/0254139 A1 9/2016 Kamimura
2019/0256805 A1 * 8/2019 Goto .................... C11D 3/3776
2020/0231900 A1 7/2020 Harada
2023/0159864 A1 5/2023 Sugishima

FOREIGN PATENT DOCUMENTS

EP 1628336 A2 * 2/2006 ......... C11D 11/0047
JP 2819392 B 10/1998
JP 6751015 B 9/2020
TW 201211238 A 3/2012
TW 202128974 A 8/2021
WO WO-0040347 A1 * 7/2000 ......... C11D 11/0047
WO WO-0204233 A1 * 1/2002 ............. C09K 13/08
WO WO-0233033 A1 * 4/2002 ............... C23G 1/20
WO WO-2021153122 A1 * 8/2021 .............. H10P 50/28

* cited by examiner

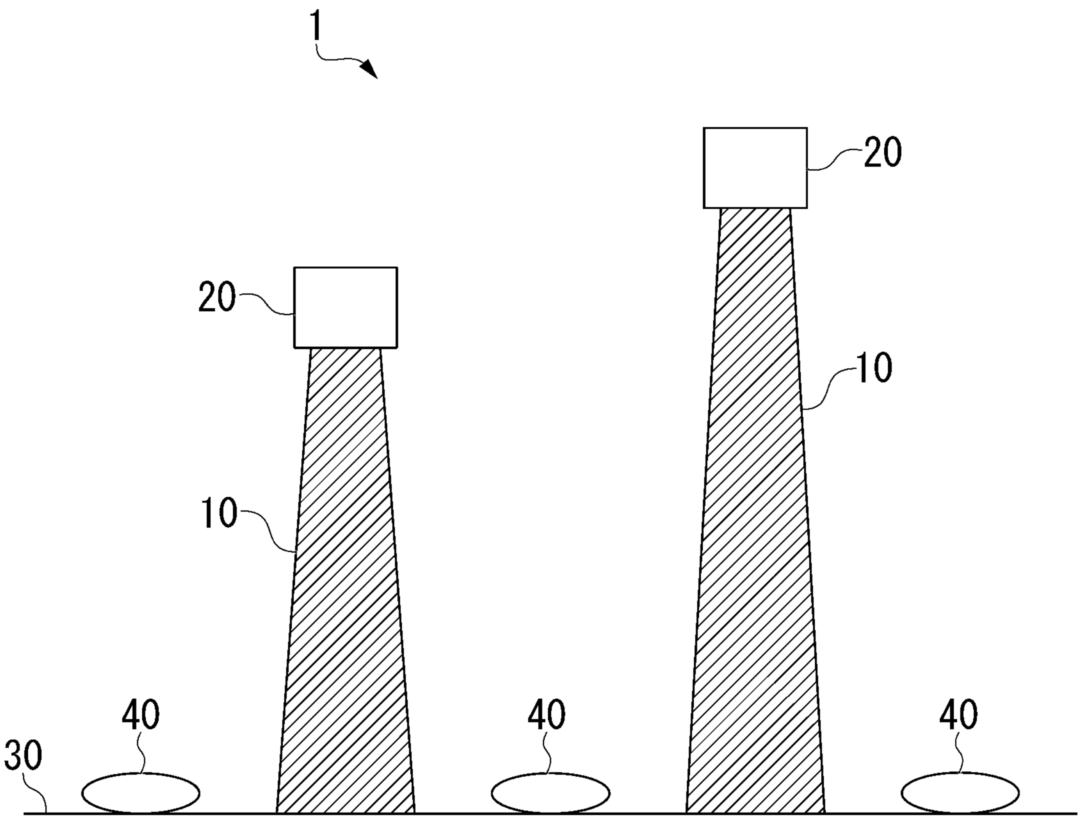
1
20
20
10
10
40
40
40
30

CLEANING LIQUID AND METHOD FOR CLEANING SUBSTRATE

BACKGROUND OF THE INVENTION

Field of the Invention

The present invention relates to a cleaning liquid and a method for cleaning a substrate.

This application claims priority to Japanese Patent Application No. 2021-214870 filed on Dec. 28, 2021, the entire content of which is incorporated herein by reference.

Description of Related Art

In recent years, in the manufacture of semiconductor devices and liquid crystal display devices, advances in lithography technology have led to rapid miniaturization of wiring patterns. For next-generation semiconductors, ruthenium, tungsten, molybdenum, and the like are being studied as wiring materials for the purpose of reducing resistance.

A wiring process includes a step of dry-etching a wiring layer using an Si-based hard mask layer as a mask in order to pattern a wiring for semi-damascene, for example. Thus, in a case where the wiring layer includes molybdenum or tungsten, a metal-containing residue derived from molybdenum or tungsten of the wiring layer and an Si-containing residue derived from the hard mask adhere to a substrate after dry etching of the wiring layer. These residues are removed by a cleaning treatment.

As a cleaning liquid for a substrate including tungsten and the like, for example, a stripping composition including an organic solvent, a nucleophilic amine, and a reducing agent is described in Japanese Patent No. 2819392.

SUMMARY OF THE INVENTION

In substrates including a molybdenum wiring or a tungsten wiring, there is a problem that these wirings are damaged by a cleaning treatment in a residue removing step after dry etching as miniaturization proceeds. Therefore, there is a demand for a cleaning liquid that does not damage the molybdenum wiring or the tungsten wiring, and has high cleanability for silicon-containing residues.

The present invention has been made in view of the circumstances, and has an object of providing a cleaning liquid that can reduce damage to a molybdenum wiring or a tungsten wiring, and has excellent cleanability; and a method for cleaning a substrate using the cleaning liquid.

In order to accomplish the object, the present invention employs the following configurations.

A first aspect of the present invention is a cleaning liquid for cleaning a substrate where at least one metal selected from the group consisting of molybdenum and tungsten is exposed on a surface, in which the cleaning liquid includes at least one hydrazine compound (A) selected from the group consisting of a compound represented by General Formula (a1), a hydrate of the compound, and a salt of the compound, a water-soluble basic compound (B) with a pH of 9.5 or more in a 0.1 M aqueous solution, which is measured at 23° C. with a pH meter, and water.

(a1)

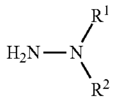

[In the formula, $R^1$ and $R^2$ each independently represents an organic group including no carbonyl group or a hydrogen atom.]

A second aspect of the present invention is a method for cleaning a substrate, including a step of cleaning a substrate where at least one metal selected from the group consisting of molybdenum and tungsten is exposed on a surface, using the cleaning liquid of the first aspect.

According to the present invention, a cleaning liquid which can reduce a damage to a molybdenum wiring or a tungsten wiring, and has good cleanability; and a method for cleaning a substrate using the cleaning liquid are provided.

BRIEF DESCRIPTION OF THE DRAWINGS

FIG. 1 shows an example of a substrate to which a cleaning liquid of one embodiment is applied.

DETAILED DESCRIPTION OF THE INVENTION (First Aspect: Cleaning Liquid)

The cleaning liquid according to the first aspect of the present invention includes at least one hydrazine compound selected from the group consisting of a compound represented by General Formula (a1), a hydrate of the compound, and a salt of the compound (A), a water-soluble basic compound (B) with a pH of 9.5 or more in a 0.1 M aqueous solution, which is measured under the following measurement conditions (1) with a pH meter at 23° C., and water.

The cleaning liquid according to this aspect is used for cleaning a substrate where at least one metal selected from the group consisting of molybdenum and tungsten is exposed on the surface.

(a1)

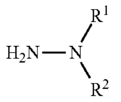

[In the formula, $R^1$ and $R^2$ each independently represent an organic group including no carbonyl group or a hydrogen atom.]

<Hydrazine Compound (A)>

The cleaning liquid according to the present embodiment contains at least one hydrazine compound (A) (hereinafter also referred to as a "(A) component") selected from the group consisting of a compound represented by General Formula (a1) (hereinafter also referred to as a "compound (A1)"), a hydrate of the compound, and a salt of the compound. The (A) component has an action of reducing a damage to a molybdenum wiring or a tungsten wiring, that is, reducing an etching rate in a cleaning treatment.

In Formula (a1), $R^1$ and $R^2$ each independently represent an organic group including no carbonyl group or a hydrogen atom. Since the organic group in $R^1$ and $R^2$ includes no carbonyl group, the compound (A) does not serve as a hydrazide.

Examples of the organic group in $R^1$ and $R^2$ include a hydrocarbon group which may have a substituent. The hydrocarbon group may be either an aliphatic hydrocarbon group or an aromatic hydrocarbon group.

The aliphatic hydrocarbon group in $R^1$ and $R^2$ may be either a saturated aliphatic hydrocarbon group or an unsaturated aliphatic hydrocarbon group. The aliphatic hydrocarbon group may be linear or branched, and may include a ring structure.

Examples of the linear aliphatic hydrocarbon group include a linear alkyl group having 1 to 10 carbon atoms, and the linear aliphatic hydrocarbon group preferably has 1 to 8 carbon atoms, more preferably has 1 to 6 carbon atoms, still more preferably has 1 to 4 carbon atoms or 1 to 3 carbon atoms, and particularly preferably has 1 or 2 carbon atoms. Specific examples thereof include a methyl group, an ethyl group, an n-propyl group, an n-butyl group, and an n-pentyl group.

Examples of the branched aliphatic hydrocarbon group include a branched alkyl group having 3 to 10 carbon atoms, and the branched aliphatic hydrocarbon group preferably has 3 to 8 carbon atoms, more preferably has 3 to 6 carbon atoms, and still more preferably has 3 or 4 carbon atoms. Specific examples thereof include an isopropyl group, an isobutyl group, a tert-butyl group, an isopentyl group, a neopentyl group, a 1,1-diethylpropyl group, and a 2,2-dimethylbutyl group.

The aliphatic hydrocarbon group including a ring structure is an aliphatic hydrocarbon group including an alicyclic group. The alicyclic group may be either a monocyclic group or a polycyclic group.

Examples of the monocyclic aliphatic hydrocarbon groups include a group obtained by removing one hydrogen atom from a monocycloalkane. The monocycloalkane preferably has 3 to 6 carbon atoms. Specific examples of the monocycloalkane include cyclopropane, cyclopentane, and cyclohexane.

Examples of the aliphatic hydrocarbon group of the polycyclic group include a group obtained by removing one hydrogen atom from a polycycloalkane. The polycycloalkane preferably has 7 to 12 carbon atoms. Specific examples of the polycycloalkane include adamantane, norbornane, isobornane, tricyclodecane, and tetracyclododecane.

The aromatic hydrocarbon group in $R^1$ and $R^2$ is a hydrocarbon group having at least one aromatic ring. The aromatic ring is not particularly limited as long as it is a cyclic conjugated system having $4n+2$ $\pi$ electrons, and may be monocyclic or polycyclic. The aromatic ring preferably has 5 to 30 carbon atoms, more preferably has 5 to 20 carbon atoms, still more preferably has 6 to 15 carbon atoms, and particularly preferably has 6 to 12 carbon atoms.

Specific examples of the aromatic ring include aromatic hydrocarbon rings such as benzene, naphthalene, anthracene, and phenanthrene; and aromatic heterocyclic rings in which some of carbon atoms constituting the aromatic hydrocarbon ring are substituted with heteroatoms. Examples of the heteroatom in the aromatic heterocyclic ring include an oxygen atom, a sulfur atom, and a nitrogen atom. Specific examples of the aromatic heterocyclic rings include a pyridine ring and a thiophene ring.

Specific examples of the aromatic hydrocarbon group include a group (an aryl group or a heteroaryl group) obtained by removing one hydrogen atom from the aromatic hydrocarbon ring or the aromatic heterocyclic ring; a group obtained by removing one hydrogen atom from an aromatic compound including two or more aromatic rings (for example, biphenyl and fluorene); and a group obtained by substituting one of the hydrogen atoms of the aromatic hydrocarbon ring or the aromatic heterocyclic ring with an alkylene group (for example, arylalkyl groups such as a benzyl group, a phenethyl group, a 1-naphthylmethyl group, a 2-naphthylmethyl group, a 1-naphthylethyl group, and a 2-naphthylethyl group). The alkylene group bonded to the aromatic hydrocarbon ring or the aromatic heterocyclic ring preferably has 1 to 4 carbon atoms, more preferably has 1 to 3 carbon atoms, and particularly preferably has 1 carbon atom.

The hydrocarbon group in $R^1$ and $R^2$ may have a substituent. The substituent is not particularly limited, but examples thereof include a hydroxy group, an alkyl group, and a vinyl group. It should be noted that the substituent includes no carbonyl group.

$R^1$ and $R^2$ are each preferably an aliphatic hydrocarbon group which may have a substituent, or a hydrogen atom, more preferably a linear or branched alkyl group which may have a substituent, or the hydrogen atom, and still more preferably a linear or branched hydroxyalkyl group, a linear or branched hydroxyalkyl group, or the hydrogen atom. The linear hydroxyalkyl group or the linear alkyl group preferably has 1 to 6 carbon atoms, more preferably has 1 to 3 carbon atoms, and still more preferably has 1 or 2 carbon atoms. The branched hydroxyalkyl group or the linear alkyl group preferably has 3 to 6 carbon atoms, and more preferably has 3 carbon atoms.

Specific examples of the compound (A1) include, but are not limited to, hydrazine, hydrazinoethanol, t-butylhydrazine, 1,1-diethylhydrazine, 1,2-diethylhydrazine, methylhydrazine, ethylhydrazine, 1,1-dimethylhydrazine, 1,2-dimethylhydrazine, 1,2-diisopropylhydrazine, cyclohexylhydrazine, allylhydrazine, isopropylhydrazine, and tolylhydrazine.

The (A) component may be a hydrate of the compound (A1). The number of hydrated water molecule in the hydrate of the compound (A1) is not particularly limited. Examples of the hydrate of the compound (A1) include a monohydrate, a dihydrate, and a trihydrate. Specific examples of the hydrate of the compound (A1) include a hydrazine monohydrate.

The (A) component may be a salt of the compound (A1). The salt of the compound (A1) may be either a salt with an inorganic substance or a salt with an organic substance. The salt is not particularly limited, but examples thereof include a hydrochloride, a sulfate, and a carbonate. Specific examples of the salt of the compound (A1) include t-butylhydrazine hydrochloride, hydrazine sulfate, hydrazine carbonate, and tolylhydrazine hydrochloride.

The (A) component may be used alone or a combination of two or more may be used.

The amount of the (A) component in the cleaning liquid of the present embodiment is not particularly limited, but is preferably 0.5% by mass (5,000 ppm) or less, more preferably 0.3% by mass (3,000 ppm) or less, and still more preferably 0.1% by mass (1,000 pm) or less, with respect to the total mass of the cleaning liquid. Since the (A) component includes a dangerous substance, it is preferable to use the (A) component at a low concentration as long as the effect of the (A) component is expressed. The amount of the (A) component in the cleaning liquid of the present embodiment may be, for example, 0.05% by mass (500 ppm) or less, 0.03% by mass (300 ppm) or less, 0.02% by mass (200 ppm) or less, or 0.01% by mass (100 ppm) or less.

The lower limit value of the amount of the (A) component is not particularly limited, but may be 0.0001% by mass (1 ppm) or more, and is preferably 0.0005% by mass (5 ppm) or more, more preferably 0.001% by mass (10 ppm) or more, still more preferably 0.002% by mass (20 ppm) or more, and particularly preferably 0.025% by mass (25 ppm) or more, with respect to the total mass of the cleaning liquid. In a case where the amount of the (A) component is the preferred lower limit value or more, the molybdenum wiring or the tungsten wiring is easily protected in a case where the substrate is cleaned with the cleaning liquid of the present embodiment.

The range of the amount of the (A) component in the cleaning liquid of the present embodiment may be 0.0001% by mass (1 ppm) to 0.5% by mass (5,000 ppm), and is preferably 0.0005% by mass (5 ppm) to 0.3% by mass (3,000 ppm), more preferably 0.001% by mass (10 ppm) to 0.2% by mass (2,000 ppm), and particularly preferably 0.002% by mass (20 ppm) to 0.1% by mass (1,000 ppm), or 0.002% by mass (20 ppm) to 0.05% by mass (500 ppm), with respect to the total mass of the cleaning liquid.

<Water-Soluble Basic Compound (B)>

The cleaning liquid of the present embodiment contains a water-soluble basic compound (B) (hereinafter also referred to as a "(B) component") with a pH of 9 or more in a 0.1 M aqueous solution, which is measured with a pH meter at 23° C. By the (B) component, the pH of the cleaning liquid can be increased. Thus, the cleaning performance is improved.

The (B) component is selected from water-soluble basic compounds having a pH with a pH of 9.5 or more in a 0.1 M aqueous solution, which is measured with a pH meter at 23° C. The pH is preferably more than 9.5, more preferably 10 or more, still more preferably 10.5 or more, and particularly preferably 11 or more. The upper limit of the pH is not particularly limited, but is, for example, 14 or less. The pH meter is not particularly limited, and a commercially available pH meter may be used. Examples of the pH meter include a portable pH meter (D-73S) manufactured by Horiba, Ltd. Examples of the water-soluble basic compound having such the pH include an amine other than the (A) component, and a quaternary hydroxide.

<<Quaternary Hydroxide: (B1) Component>>

The (B) component may be a quatemary hydroxide (hereinafter also referred to as a "(B1) component"). Examples of the (B1) component include a compound represented by General Formula (b1).

(b1)

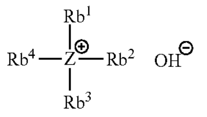

[In the formula, $Rb^1$ to $Rb^4$ each independently represent a hydrocarbon group which may have a substituent; and Z represents a nitrogen atom or a phosphorus atom.]

In Formula (b1), $Rb^1$ to $Rb^4$ each independently represent a hydrocarbon group which may have a substituent.

The hydrocarbon group which may have a substituent in $Rb^1$ to $Rb^4$ may be an aliphatic hydrocarbon group which may have a substituent or an aromatic hydrocarbon group which may have a substituent. Examples of the aliphatic hydrocarbon group include those provided as exemplary examples for $R^1$ and $R^2$ in Formula (a1). Examples of the aromatic hydrocarbon group include the same groups as those provided as exemplary examples for $R^1$ and $R^2$ in Formula (a1).

The hydrocarbon group in $Rb^1$ to $Rb^4$ may have a substituent. The substituent is not particularly limited, but examples thereof include a hydroxy group.

$Rb^1$ to $Rb^4$ are each preferably an aliphatic hydrocarbon group which may have a substituent, more preferably a linear or branched alkyl group which may have a substituent, and still more preferably a linear or branched hydroxyalkyl group, a linear or branched hydroxyalkyl group, or a hydrogen atom. The linear hydroxyalkyl group or the linear alkyl group preferably has 1 to 6 carbon atoms, more preferably has 1 to 3 carbon atoms, and still more preferably has 1 or 2 carbon atoms. The branched hydroxyalkyl group or the linear alkyl group preferably has 3 to 6 carbon atoms, and more preferably has 3 carbon atoms.

In Formula (b1), Z represents a nitrogen atom or a phosphorus atom.

In a case where the (B1) component is a quaternary amine hydroxide, specific examples thereof include tetraethylammonium hydroxide (TEAH), tetramethylammonium hydroxide (TMAH), tetrapropylammonium hydroxide (TPAH), dimethylbis(2-hydroxyethyl)ammonium hydroxide (DMEMAH), tetrabutylammonium hydroxide (TBAH), tetrapropylammonium hydroxide (TPAH), tris(2-hydroxyethyl)methylammonium hydroxide (THEMAH), choline, dimethyldiethylammonium hydroxide, tetraethanolammonium hydroxide, benzyltrimethylammonium hydroxide, benzyltriethylammonium hydroxide, and benzyltributylammonium hydroxide.

In a case where the (B1) component is a quaternary phosphonium hydroxide, specific examples thereof include tetrabutylphosphonium hydroxide, tetrapropylphosphonium hydroxide, tetraethylphosphonium hydroxide, tetramethylphosphonium hydroxide, tetraphenylphosphonium hydroxide, methyltriphenylphosphonium hydroxide, ethyltriphenylphosphonium hydroxide, propyltriphenylphosphonium hydroxide, butyltriphenylphosphonium hydroxide, benzyltriphenylphosphonium hydroxide, allyltriphenylphosphonium hydroxide, dodecyltriphenylphosphonium hydroxide, tetradecyltriphenylphosphonium hydroxide, hexadecyltriphenylphosphonium hydroxide, and hexadecyltributylphosphonium hydroxide.

The component (B1) is preferably TEAH, TMAH, THEMAH, choline, and tetrabutylphosphonium hydroxide, more preferably TEAH, TMAH, DMEMAH, THEMAH, and choline, and still more preferably TEAH, TMAH, and THEMAH.

<<Amine Other than (A) Component: (B2) Component>>

The (B) component may be an amine other than the (A) component (hereinafter also referred to as a "(B2) component"). It should be noted that those corresponding to the (B1) component are excluded from the (B2) component. Examples of the (B2) component include ammonia, a primary monoamine, a secondary monoamine, a tertiary monoamine, a quaternary ammonium salt other than a hydroxide, a secondary cyclic amine, a tertiary cyclic amine, a quaternary cyclic amine, a diamine, and a polyamine. The (B2) component is preferably an aliphatic amine from the viewpoint of water solubility. From the viewpoint of the pH, it is preferable that the (B2) component is not the primary alkanol monoamine, the secondary alkanol monoamine, or the tertiary alkanol monoamine.

Examples of the primary monoamines include, but are not limited to, alkylamines such as methylamine, ethylamine, propylamine, n-butylamine, isopropylamine, and tert-butylamine; cycloalkylamines such as cyclopentylamine, cyclohexylamine, and cyclohexanemethylamine; and alkoxyamines such as methoxyethylamine, methoxypropylamine, methoxybutylamine, ethoxypropylamine, and propoxypropylamine; and other hydroxyamines.

Examples of the secondary monoamines include, but are not limited to, alkylamines such as dimethylamine, diethylamine, methylethylamine, dipropylamine, diisopropylamine, dibutylamine, diisobutylamine, and butylmethylamine; cycloalkylamines such as N,N-dicyclohexylamine and N-cyclopentylcyclohexanamine; and alkoxyamines such as methoxy(methylamine) and N-(2-methoxyethyl)ethylamine.

Examples of the tertiary monoamines include, but are not limited to, alkylamines such as trimethylamine, triethylamine, tripropylamine, tributylamine, triisobutylamine, dimethylethylamine, dimethylpropylamine, allyldiethylamine, dimethyl-n-butylamine, and diethylisopropylamine; and cycloalkylamines such as tricyclopentylamine and tricyclohexylamine.

Examples of the quaternary ammonium salts include quaternary ammonium fluorides, chlorides, bromides, iodides, sulfates, hydrogensulfates, and acetates. Examples of a quaternary ammonium cation include the same ones as the cation moiety of Formula (b1). Specific examples of the quaternary ammonium salts include, but are not limited to, tetraethylammonium chloride, tetramethylammonium chloride, tetrapropylammonium chloride, tetrabutylammonium chloride, tetrapropylammonium chloride, tetraethylammonium bromide, tetramethylammonium bromide, tetrapropylammonium bromide, tetrabutylammonium bromide, tetrapropylammonium bromide, tetraethylammonium fluoride, tetramethylammonium fluoride, tetrapropylammonium fluoride, tetrabutylammonium fluoride, tetrapropylammonium fluoride, tetraethylammonium iodide, tetramethylammonium iodide, tetrapropylammonium iodide, tetrabutylammonium iodide, tetrapropylammonium iodide, tetraethylammonium hydrogensulfate, tetramethylammonium hydrogensulfate, and tetrabutylammonium hydrogensulfate.

Examples of the secondary cyclic amines include piperidines (compounds having a piperidine skeleton), pyrrolidines (compounds having a pyrrolidine skeleton), and morpholines (compounds having a morpholine skeleton). Examples of the piperidines which are secondary cyclic amines include piperidine, 2-pipecoline, 3-pipecoline, 4-pipecoline, 2,6-dimethylpiperidine, and 3,5-dimethylpiperidine. Examples of the pyrrolidines include pyrrolidine, 2-methylpyrrolidine, and 3-methylpyrrolidine. Examples of the morpholines include morpholine, 2-methylmorpholine, and 3-methylmorpholine.

Examples of the tertiary cyclic amines include piperidines, pyrrolidines, and morpholines. Examples of the piperidines include N-methylpiperidine. Examples of the pyrrolidines include N-methylpyrrolidine. Examples of the morpholines include N-methylmorpholine.

Examples of the quaternary cyclic amines include fluorides such as piperidines, pyrrolidines, and morpholines, chlorides, bromides, iodides, sulfates, hydrogensulfates, and acetates.

The diamine may be any of a primary diamine, a secondary diamine, and a tertiary diamine. Examples of the primary diamine include, but are not limited to, 2-(2-aminoethylamino)ethanol, ethylenediamine, butane-1,4-diamine, 1,3-propanediamine, 1,6-hexanediamine, and pentane-1,5-diamine. Examples of the secondary diamine include, but not limited to, 2-methylpiperazine, 2,3-dimethylpiperazine, 2,5-dimethylpiperazine, N,N'-dimethylethanediamine, N,N'-dimethylpropanediamine, N,N'-diethylethylenediamine, N,N'-diethylpropanediamine, and N,N'-diisopropylethylenediamine. Examples of the tertiary diamine include, but are not limited to, 4-dimethylaminopyridine, N,N,N',N'-tetramethylethylenediamine, N,N,N',N'-tetraethylethylenediamine, N,N,N',N'-tetramethyl-1,3-diaminopropane, N,N,N',N'-tetramethyl-1,3-diaminobutane, N',N'-tetramethyl-1,4-diaminobutane, N,N,N',N'-tetramethylphenylenediamine, and 1,2-dipiperidinoethane.

The polyamines are compounds including three or more amino groups. The polyamines may include any of a primary amino group, a secondary amino group, and a tertiary amino group. Examples of the polyamines include spermine, spermidine, 3,3'-iminobis(propylamine), N,N-bis(3-aminopropyl)methylamine, N,N-bis(3-aminopropyl)butylamine, N-(3-aminopropyl)-N-dodecylpropane-1,3-diamine, N,N,N',N",N"-pentamethyldiethylenetriamine, N,N,N',N",N"-pentamethyldipropylenetriamine, tris[2-(dimethylamino)ethyl]amine, 2-aminomethylpyrimidine, 1,4-bis(3-aminopropyl)piperazine, 1-amino-4-cyclopentylpiperazine, and 1-(2-pyridyl)piperazine.

The (B2) component may be any of the amines, but is preferably the primary monoamine, the secondary monoamine, the tertiary monoamine, the quaternary ammonium salt, the diamine, or the polyamine, and more preferably the diamine or the polyamine.

The (B) component is preferably the (B1) component, the primary monoamine, the secondary monoamine, the tertiary monoamine, the quaternary ammonium salt, the diamine, or the polyamine, more preferably the (B1) component, the quaternary ammonium salt, the diamine, or the polyamine, and particularly preferably the (B1) component.

The (B) component may be used alone or a combination of two or more may be used.

The amount of the (B) component in the cleaning liquid of the present embodiment is not particularly limited, but is preferably 20% by mass or less, more preferably 15% by mass or less, still more preferably 10% by mass or less, and particularly preferably 5% by mass or less, with respect to the total mass of the cleaning liquid. The lower limit value of the amount of the (B) component is not particularly limited, but may be 0.0001% by mass or more, and is preferably 0.001% by mass or more, more preferably 0.01% by mass or more, still more preferably 0.05% by mass or more, and particularly preferably 0.1% by mass or more, or 0.3% by mass or more, with respect to the total mass of the cleaning liquid. In a case where the amount of the (B) component is the preferred lower limit value or more, it is easy to maintain the pH of the cleaning liquid at a high level. In a case where the amount of the (B) component is the preferred upper limit value or less, it is easier to achieve a balance with other components.

The range of the amount of the (B) component in the cleaning liquid of the present embodiment may be 0.00010% by mass to 20% by mass, and is preferably 0.0010% by mass to 15% by mass, more preferably 0.01% by mass to 10% by mass, and particularly preferably 0.05% by mass to 5% by mass, or 0.1% by mass to 5% by mass, with respect to the total mass of the cleaning liquid.

The cleaning liquid of the present embodiment may not contain the (B1) component as long as it contains the (B2) component. The cleaning liquid of the present embodiment may contain no other (B1) components as long as it contains one (B1) component. The cleaning liquid of the present embodiment may not contain, for example, one or more of the compounds provided as specific exemplary examples of the quaternary hydroxide.

The cleaning liquid of the present embodiment may not contain the (B2) component as long as it contains the (B1) component. The cleaning liquid of the present embodiment may contain no other (B2) component as long as it contains one (B2) component. The cleaning liquid of the present embodiment may not contain, for example, one or more selected from the group consisting of a primary monoamine, a secondary monoamine, a tertiary monoamine, a quaternary ammonium salt, a secondary cyclic amine, a tertiary cyclic amine, a quaternary cyclic amine, a diamine, and a polyamine. The cleaning liquid of the present embodiment may not contain, for example, one or more of the compounds provided as specific exemplary examples of these amines. The cleaning liquid of the present embodiment may not contain, for example, one or more selected from the group consisting of a primary alkanol monoamine, a secondary alkanol monoamine, a tertiary alkanol monoamine, a primary aromatic monoamine, a secondary aromatic monoamine, a tertiary aromatic monoamine, a quaternary aromatic ammonium salt, a primary aminophenol, a secondary aminophenol, a tertiary aminophenol, an aromatic diamine, and an aromatic polyamine.

<Water>

The cleaning liquid of the present embodiment contains water as a solvent. The water may include trace ingredients which are unavoidably included. The water used in the cleaning liquid of the present embodiment is preferably water that has been subjected to a purification treatment, such as distilled water, ion exchange water, and ultrapure water, and ultrapure water generally used in the production of a semiconductor is more preferably used.

The amount of water in the cleaning liquid of the present embodiment is not particularly limited, but is preferably 80% by mass or more, more preferably 90% by mass or more, still more preferably 95% by mass or more, and particularly preferably 97% by mass or more. The upper limit value of the amount of water in the cleaning liquid of the present embodiment is not particularly limited, but is preferably less than 99.95% by mass, more preferably 99.9% by mass or less, and still more preferably 99.7% by mass or less.

<Optional Components>

The cleaning liquid of the present embodiment may include optional components in addition to the (A) component and the (B) component. Examples of the optional components include a hydroxycarboxylic acid, a water-soluble organic solvent, a surfactant, and an anticorrosive agent.

<<Anticorrosive Agent>>

The cleaning liquid of the present embodiment may contain an anticorrosive agent.

Examples of the anticorrosive agent include compounds including a nitrogen-containing heterocyclic ring such as a triazole ring, an imidazole ring, a pyridine ring, a phenanthroline ring, a tetrazole ring, a pyrazole ring, a pyrimidine ring, and a purine ring.

Examples of the compound including a triazole ring include triazoles such as 1,2,3-triazole, 1,2,4-triazole, 3-amino-1H-1,2,4-triazole, 1-acetyl-1H-1,2, 3-triazolo[4,5-b]pyridine, 1H-1,2,3-triazolo[4,5-b]pyridine, 1,2,4-triazolo [4,3-a]pyridin-3(2H)-one, and 3H-1,2,3-triazolo[4,5-b]pyridin-3-ol; and benzotriazoles such as 1,2,3-benzotriazole, 5-methyl-1H-benzotriazole, 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-carboxyl-1H-benzotriazole methyl ester, 4-carboxyl-1H-benzotriazole butyl ester, 4-carboxyl-1H-benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl] phosphonic acid, and 3-aminotriazole.

Examples of the compound including an imidazole ring include imidazoles such as 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole, and 2-aminoimidazole; and biimidazoles such as 2,2'-biimidazole. Among those, the biimidazoles are preferable, and 2,2'-biimidazole is more preferred.

Examples of the compound including a pyridine ring include pyridines such as 1H-1,2,3-triazolo[4,5-b]pyridine, 1-acetyl-1H-1,2,3-triazolo[4,5-b]pyridine, 3-aminopyridine, 4-aminopyridine, 3-hydroxypyridine, 4-hydroxypyridine, 2-acetamidopyridine, 4-pyrrolidinopyridine, 2-cyanopyridine, 2,6-pyridinecarboxylic acid, and 2,4,6-trimethylpyridine; and bipyridyls such as 2,2'-bipyridyl, 4,4'-dimethyl-2,2'-bipyridyl, 4,4'-di-tert-butyl-2,2'-bipyridyl, 4,4-dinonyl-2,2-bipyridyl, 2,2"-bipyridine-6,6'-dicarboxylic acid, and 4,4'-dimethoxy-2,2'-bipyridyl. Among those, bipyridyls are preferable, and 2,2'-bipyridyl, 4,4'-dimethyl-2,2'-bipyridyl, 4,4'-di-tert-butyl-2,2'-bipyridyl, 4,4-dinonyl-2,2-bipyridyl, 2,2"-bipyridine-6,6'-dicarboxylic acid, and 4,4'-dimethoxy-2,2'-bipyridyl are more preferable.

Examples of the compound including a phenanthroline ring include 1,10-phenanthroline.

Examples of the compound including a tetrazole ring include 1H-tetrazole, 5-amino-1H-tetrazole, 5-methyl-1H-tetrazole, 5-phenyl-1H-tetrazole, and 1-(2-diaminoethyl)-5-mercaptotetrazole.

Examples of the compound including a pyrazole ring include 3,5-dimethylpyrazole, 3-amino-5-methylpyrazole, 4-methylpyrazole, and 3-amino-5-hydroxypyrazole.

Examples of the compound including a pyrimidine ring include pyrimidine, 4-methylpyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraaminopyrimidinesulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxypyrimidine, 2,4-diaminopyrimidine, 2-acetamidopyrimidine, 2-aminopyrimidine, 2-methyl-5,7-diphenyl-(1,2,4)triazolo(1,5-a)pyrimidine, 2-methylsulfanyl-5,7-diphenyl-(1,2,4)triazolo(1,5-a)pyrimidine, 2-methylsulfanyl-5,7-diphenyl-4,7-dihydro-(1,2,4)triazolo(1,5-a)pyrimidine, and 4-aminopyrazolo[3,4-d]pyrimidine.

Examples of the compound including a purine ring include adenine, guanine, hypoxanthine, xanthine, uric acid, and theophylline.

The anticorrosive agent may be used alone or a combination of two or more may be used.

In a case where the cleaning liquid of the present embodiment contains the anticorrosive agent, the amount of the anticorrosive agent is not particularly limited, but is preferably 0.0001% by mass to 0.2% by mass (1 ppm to 2,000 ppm), more preferably 0.0003% by mass to 0.1% by mass (3 ppm to 1,000 ppm), still more preferably 0.0005% by mass to 0.05% by mass (5 ppm to 500 ppm), and particularly preferably 0.01% by mass to 0.03% by mass (10 ppm to 300 ppm), with respect to the total mass of the cleaning liquid.

The cleaning liquid of the present embodiment may not include one or more selected from the group consisting of a compound including a triazole ring, a compound including an imidazole ring, a compound including a pyridine ring, a compound including a phenanthroline ring, a compound including a tetrazole ring, a compound including a pyrazole ring, a compound including a pyrimidine ring, and a compound including a purine ring, and may not contain one or more of the compounds provided as specific exemplary examples of the anticorrosive agent. The cleaning liquid of the present embodiment may not contain the anticorrosive agent.

<<Buffer>>

The cleaning liquid of the present embodiment may contain a buffer. The buffer is a compound having an action of suppressing a change in the pH of a solution.

The buffer is not particularly limited as long as it is a compound having a pH buffering ability. As the buffer, for example, a compounds with a pKa of 6 to 11 can be used.

Examples of the buffer include a Good's buffer. Example of the Good's buffer include 2-cyclohexylaminoethanesulfonic acid (CHES), 3-cyclohexylaminopropanesulfonic acid (CAPS), N-tris(hydroxymethyl)methyl-3-aminopropanesulfonic acid (TAPS), 4-(cyclohexylamino)-1-butanesulfonic acid (CABS), tricine, bicine, 2-morpholinoethanesulfonic acid monohydrate (MES), bis(2-hydroxyethyl)aminotris (hydroxymethyl)methane (Bis-Tris), N-(2-acetamido) iminodiacetic acid (ADA), piperazine-1,4-bis(2-ethanesulfonic acid) (PIPES), N-(2-acetamido)-2-aminoethanesulfonic acid (ACES), 2-hydroxy-3-morpholinopropanesulfonic acid (MOPSO), N,N-bis(2-hydroxyethyl)-2-aminoethanesulfonic acid (BES), 3-morpholinopropanesulfonic acid (MOPS), N-tris(hydroxymethyl)methyl-2-aminoethanesulfonic acid (TES), 2-[4-(2-hydroxyethyl)-1-piperazinyl]ethanesulfonic acid (HEPES), 3-[N-tris(hydroxymethyl)methylamino]-2-hydroxypropanesulfonic acid (TAPSO), piperazine-1,4-bis(2-hydroxypropanesulfonic acid) (POPSO), 4-(2-hydroxyethyl)piperazine-1-(2-hydroxypropane-3-sulfonic acid) (HEPSO), and 4-(2-hydroxyethyl)-1-piperazinepropanesulfonic acid (EPPS).

The buffer may be used alone or a combination of two or more may be used.

In a case where the cleaning liquid of the present embodiment contains the buffer, the amount of the buffer is not particularly limited, but may be 0.0010% by mass to 10% by mass, and is preferably 0.005% by mass to 5% by mass, more preferably 0.01% by mass to 1% by mass, and particularly preferably 0.05% by mass to 0.5% by mass, or 0.05% by mass to 0.3% by mass, with respect to the total mass of the cleaning liquid.

The cleaning liquid of the present embodiment may not contain the buffer, and may not contain one or more of the compounds provided as specific exemplary examples of the buffer.

<<Organic Solvent: (S)>>

The cleaning liquid of the present embodiment may contain an organic solvent within a range that does not impair the effect of the present invention. The organic solvent is preferably a water-soluble organic solvent. Examples of the water-soluble organic solvent include alcohols (for example, isopropanol, ethanol, ethylene glycol, propylene glycol, glycerin, 1,3-propanediol, 1,3-butanediol, 1,4-butanediol, diethylene glycol, dipropylene glycol, furfuryl alcohol, 2-methyl-2,4-pentanediol, and 3-methoxy-3-methyl-1-butanol), dimethyl sulfoxide, and ethers (for example, ethylene glycol dimethyl ether, diethylene glycol dimethyl ether, triethylene glycol dimethyl ether, tetraethylene glycol dimethyl ether, propylene glycol dimethyl ether), and morpholines (for example, N-methylmorpholine N-oxide).

The organic solvent may be used alone or a combination of two or more may be used.

In a case where the cleaning liquid of the present embodiment contains the organic solvent, the amount of the organic solvent is preferably 50% by mass or less, more preferably 30% by mass or less, still more preferably 20% by mass or less, and further still more preferably 10% by mass or less, with respect to the total amount of water and organic solvent.

In a case where the cleaning liquid of the present embodiment contains the organic solvent, the range of the amount of the organic solvent is preferably 0.05% to 50% by mass, more preferably 0.1% to 30% by mass, still more preferably 0.10% to 20% by mass, and further still more preferably 0.10% to 10% by mass, with respect to the total amount of water and organic solvent.

The cleaning liquid of the present embodiment may not contain the organic solvent or the water-soluble organic solvent, and may not contain one or more of the compounds provided as specific exemplary examples of the water-soluble organic solvent.

<<Surfactant>>

The cleaning liquid of the present embodiment may contain a surfactant, for example, for the purpose of adjusting the wettability of the cleaning liquid to a substrate. Examples of the surfactant include a nonionic surfactant, an anionic surfactant, a cationic surfactant, and an amphoteric surfactant.

Examples of the nonionic surfactant include polyalkylene oxide alkylphenyl ether-based surfactants, polyalkylene oxide alkyl ether-based surfactants, block polymer-based surfactants consisting of polyethylene oxide and polypropylene oxide, polyoxyalkylene distyrenated phenyl ether-based surfactants, polyalkylene tribenzylphenyl ether-based surfactants, and acetylene polyalkylene oxide-based surfactants.

Examples of the anionic surfactant include alkylsulfonic acids, alkylbenzenesulfonic acids, alkylnaphthalenesulfonic acids, alkyldiphenyl ether sulfonic acids, fatty acid amidosulfonic acids, polyoxyethylene alkyl ether carboxylic acids, polyoxyethylene alkyl ether acetic acids, polyoxyethylene alkyl ether propionic acids, alkyl phosphonic acids, and fatty acid salts. Examples of the "salts" include ammonium salts, sodium salts, potassium salts, and tetramethylammonium salts.

Examples of the cationic surfactant include alkylpyridium-based surfactants. A quaternary ammonium salt-based surfactant may be used as the (B2) component.

Examples of the amphoteric surfactant include betaine type surfactants, amino acid type surfactants, imidazoline type surfactants, and amine oxide type surfactants.

These surfactants are generally commercially available. The surfactant may be used alone or a combination of two or more may be used.

In a case where the cleaning liquid of the present embodiment contains the surfactant, the amount of the surfactant is not particularly limited, but is, for example, preferably 0.0001% by mass to 5% by mass, more preferably 0.0002% by mass to 3% by mass, still more preferably 0.002% by mass to 1% by mass, and particularly preferably 0.002% by mass to 0.2% by mass with respect to the total mass of the cleaning liquid. In a case where the amount of the surfactant is within the preferred range, bubbles generated by the foaming agent are likely to be dense.

The cleaning liquid of the present embodiment may not contain one or more selected from the group consisting of a nonionic surfactant, an anionic surfactant, a cationic surfactant, and an amphoteric surfactant, and may not contain one or more of the compounds provided as exemplary examples as the surfactant. The cleaning liquid of the present embodiment may not contain the surfactant.

<<Impurities and the Like>>

The cleaning liquid of the present embodiment may include metal impurities including metal atoms such as a Fe atom, a Cr atom, an Ni atom, a Zn atom, a Ca atom, and a Pb atom. The total amount of the metal atoms in the cleaning liquid of the present embodiment is preferably 100 ppt by mass or less with respect to the total mass of the cleaning liquid. The lower limit value of the total amount of the metal atoms is preferably as low as possible, but may be, for example, 0.001 ppt by mass or more. The total amount of the metal atoms may be, for example, 0.001 ppt by mass to 100 ppt by mass. By setting the total amount of the metal atoms to the preferred upper limit value or less, the defect suppressing properties and the residue suppressing properties of the cleaning liquid are improved. It is considered that by making the total amount of the metal atoms to the preferred lower limit value or more, the metal atoms are less likely to be free in the system and less likely to adversely affect a production yield of the entire object to be cleaned.

The amount of the metal impurities can be adjusted, for example, by a purification treatment such as filtering. A purification treatment such as filtering may be performed on a part or all of the raw materials before preparing the cleaning liquid, or may be performed after preparing the cleaning liquid.

The cleaning liquid of the present embodiment may include, for example, organic substance-derived impurities (organic impurities). The total amount of the organic impurities in the cleaning liquid of the present embodiment is preferably 5,000 ppm by mass or less. The lower limit of the amount of the organic impurities is more preferable, but may be, for example, 0.1 ppm by mass or more. The total amount of the organic impurities may be, for example, 0.1 ppm by mass to 5,000 ppm by mass.

The cleaning liquid of the present embodiment may include, for example, objects to be counted having a size that can be counted by a light scattering type in-liquid particle counter. The size of the object to be counted is, for example, 0.04 μm or more. The number of the objects to be counted in the cleaning liquid of the present embodiment is, for example, 1,000 or less per mL of the cleaning liquid, and the lower limit value is, for example, 1 or more. It is considered that in a case where the number of the objects to be counted in the cleaning liquid is within the range, the metal corrosion suppressing effect of the cleaning liquid is improved.

The organic impurities and/or the objects to be counted may be incorporated into the cleaning liquid, or may be inevitably mixed in the cleaning liquid during a step of producing the cleaning liquid. Examples of the cases where organic impurities are unavoidably incorporated in the step of producing the cleaning liquid include, but are not limited to, a case where organic impurities are included in raw materials (for example, an organic solvent) used in the production of the cleaning liquid, and a case where organic impurities are incorporated (for example, contamination) from the external environment during the step of producing the cleaning liquid.

In a case where the objects to be counted are added to the cleaning liquid, the existence ratio may be adjusted for each specific size in consideration of a surface roughness and the like of a cleaning target.

<pH>

The pH of the cleaning liquid of the present embodiment may be, for example, 9 or more and 14 or less. The pH of the cleaning liquid is preferably pH 9.5 or more, more preferably pH 10 or more, still more preferably pH 10.5 or more, and particularly preferably pH 11 or more. The pH of the cleaning liquid is more preferably pH 13 or less. The pH range of the cleaning liquid is preferably pH 11 to pH 13.5, and more preferably pH 11 to 13.

The pH value is a value measured with a pH meter under conditions of a normal temperature (23° C.) and a normal pressure (1 atm).

<Storage Container>

A method for storing the cleaning liquid of the present embodiment is not particularly limited, and storage containers known in the related art can be used. In order to ensure the stability of the cleaning liquid, a void ratio in a container in a case of storing the cleaning liquid in the container and/or a type of gas filling the voids may be appropriately set. For example, the void ratio in the storage container may be approximately 0.01% to 30% by volume.

In a case of using the cleaning liquid of the present embodiment, the cleaning liquid may be diluted 2 to 2,000 times to obtain a diluted liquid, and then a cleaning step may be performed using the diluted liquid.

In one embodiment, the cleaning liquid does not contain one or more selected from the group consisting of a hydrazide compound, an ethylene oxide-containing compound, a propylene oxide-containing compound, an alkylene oxide-containing compound, a fluorine compound, sugars, sugar alcohols, catechols, inorganic alkali compounds, alcohols, glycerin, glycerin derivatives, ascorbic acid, carbohydrazide, hydroquinone, hydroquinone monomethyl ether, hydroxyamine, diethylhydroxyamine, dimethylglyoxime, methylethylketoxime, ammonium sulfite, carboxylic acids, polyphosphonic acids, arylphosphonic acids, ammonium salts of carboxylic acids, ammonium salts of polyphosphonic acids, ammonium salts and alkali metal salts of arylphosphonic acids, saturated aliphatic monohydric alcohols, alkoxy alcohols, glycols, glycol ethers, ketones, nitriles, aminopolycarboxylic acids, hydroxycarboxylic acids, purines, azoles, pyrimidines, thiazoles, thiazolinones, polyphenols, barbiturates, abrasives, Schiff bases, arabinose, xylitol, sorbitol, glucose, ribose, fructose, and triethanolamine.

<Substrate>

The substrate to which the cleaning liquid of the present embodiment is applied is a substrate where at least one metal selected from the group consisting of molybdenum and tungsten is exposed on the surface. The substrate is not particularly limited as long as it is a substrate where molybdenum or tungsten is exposed on the surface.

The substrate preferably includes a metal-containing layer that contains at least one metal selected from the group consisting of molybdenum and tungsten. Molybdenum or tungsten contained in the metal-containing layer may be a simple substance, an alloy, or a compound. Examples of the molybdenum or tungsten compound include oxides, nitrides, and oxynitrides. The amount of molybdenum or tungsten in the metal-containing layer is preferably 20% by mass or more, more preferably 50% by mass or more, still more preferably 80% by mass or more, and may be 100% by mass, with respect to the total mass of the composition forming the metal-containing layer. The metal-containing layer can be formed by a known method, and for example, CVD, ALD, or PVD can be used.

The metal-containing layer that contains molybdenum or tungsten is preferably a wiring layer. The metal-containing layer may be, for example, a molybdenum wiring layer or a tungsten wiring layer. The cleaning liquid of the present embodiment may be used, for example, to clean a substrate after dry etching of a metal-containing layer that contains molybdenum or tungsten. More specifically, the cleaning liquid of the present embodiment may be used to clean a substrate after dry etching of a molybdenum wiring layer or a tungsten wiring layer.

FIG. 1 shows an example of a substrate to which a cleaning liquid of the present embodiment is applied. A substrate 1 shown in FIG. 1 is, for example, a substrate after performing a dry etching of a wiring layer. In the substrate 1, a wiring layer 10 is formed on a dielectric layer 30, and a hard mask layer 20 is formed on the wiring layer 10. The substrate 1 is after dry etching of the wiring layer 10 using the hard mask layer 20 as a mask. A residue 40 which is a dry etching residue adheres to the substrate 1.

In the substrate 1, the wiring layer 10 is a molybdenum wiring layer or a tungsten wiring layer. The hard mask layer 20 is formed of silicon dioxide ($SiO_2$) or silicon nitride (SiN), for example. The residue 40 includes molybdenum oxide or tungsten oxide, and a silicon-containing residue.

In a case where the substrate 1 is cleaned with a cleaning liquid in the related art, molybdenum or tungsten contained in the wiring layer 10 corrodes due to a contact with the cleaning liquid. As a result, the molybdenum wiring or the tungsten wiring is damaged by the cleaning treatment.

On the other hand, by incorporation of the (A) component into the cleaning liquid of the present embodiment, molybdenum or tungsten is protected. On the other hand, by incorporation of the (B) component, the silicon-containing residue 40 can be cleaned well. As a result, the residue 40 can be cleaned while the wiring layer 10 containing molybdenum or tungsten is protected.

According to the cleaning liquid of the present embodiment, by incorporation of the hydrazine compound (A) and the water-soluble basic compound (B), the silicon-containing residue can be cleaned well while molybdenum or tungsten is protected in the substrate where molybdenum or tungsten is exposed on the surface. As a result, it can be suitably applied to cleaning of the substrate after dry etching of the molybdenum wiring layer or the tungsten wiring layer.

(Method for Cleaning Substrate: Second Aspect)

A method for cleaning a substrate according to a second aspect includes a step of cleaning a substrate using the cleaning liquid according to the first aspect. The substrate is a substrate where at least one metal selected from the group consisting of molybdenum and tungsten is exposed on the surface.

<Step of Cleaning Substrate: Cleaning Step>

The present step is a step of etching a substrate using the treatment liquid according to the first aspect. The present step includes an operation of bringing the cleaning liquid into contact with the substrate. A method for the cleaning method is not particularly limited, and a known cleaning method can be used. Examples of such the method include a method of continuously applying a cleaning liquid onto a substrate rotating at a constant speed (rotation coating method), a method of immersing a substrate in a cleaning liquid for a certain period of time (dipping method), and a method of spraying a cleaning liquid onto a surface of a substrate (spray method).

The temperature at which the cleaning treatment is performed is not particularly limited. The temperature for the cleaning treatment may be, for example, 15° C. to 70° C., 20° C. to 70° C., 30° C. to 65° C., or 40° C. to 65° C. By raising the temperature of the treatment liquid, the cleaning performance is improved, but the temperature of the cleaning liquid can be appropriately selected in consideration of suppression of a change in the composition of the cleaning liquid, workability, safety, cost, and the like.

As the cleaning time, a time sufficient for removing impurities, residues, and the like from a surface of the substrate can be appropriately selected. Examples of the cleaning time include 10 seconds to 30 minutes, 20 seconds to 15 minutes, 30 seconds to 10 minutes, or 30 seconds to 5 minutes.

The cleaning liquid according to the first aspect may be diluted 2- to 2,000-fold to obtain a diluted liquid at the time of use. In the present step, the substrate may be cleaned using the diluted liquid.

<Substrate>

Examples of a substrate to be cleaned include the same substrates as those described as a target to which the cleaning liquid according to the first aspect is applied. The substrate may be a substrate (for example, FIG. 1) after performing a dry etching of a layer containing molybdenum or tungsten by a wiring process. The substrate may be a substrate after performing a dry etching of the wiring layer by, for example, a semi-damascene process. In addition, the substrate may be a substrate in which molybdenum or tungsten after dry etching of an Si-containing layer (for example, an Si-containing insulating film) in a wiring process is exposed. In addition, the substrate may be a substrate where molybdenum or tungsten is exposed after a CMP step in a wiring process. In particular, in a case where the CMP slurry includes an Si-based filler, cleaning with the cleaning liquid according to the first aspect is useful.

<Optional Steps>

The method of the present embodiment may include optional steps in addition to the cleaning step. Examples of the optional steps include a hard mask layer etching step, a wiring layer dry-etching step, and a contact etching step.

(Hard Mask Layer Etching Step)

The method of the present embodiment may include a hard mask layer etching step prior to the cleaning step. The hard mask layer etching step is a step of etching a hard mask layer. Examples of the material for the hard mask layer include silicon dioxide ($SiO_2$), silicon nitride ($Si_3N_4$), and silicon oxynitride (SiON). Examples of the method for forming a hard mask layer include CVD, ALD, and PVD.

Etching of the hard mask layer can be performed using, for example, a resist pattern as a mask. Etching of the hard mask layer can be performed, for example, by dry etching. Examples of the etching gas include a mixture of an oxygen gas and a halogen-based gas. Examples of the halogen-containing gas include fluorocarbon-based gases such as a tetrafluoromethane ($CF_4$) gas and a trifluoromethane ($CHF_3$) gas; and chlorine-based gases such as a chlorine ($Cl_2$) gas.

(Wiring Layer Dry-Etching Step)

The method of the present embodiment may include a wiring layer dry-etching step prior to the cleaning step. The wiring layer dry-etching step is a step of dry-etching the wiring layer. In the method of the present embodiment, the wiring layer contains at least one metal selected from the group consisting of molybdenum and tungsten. Examples of a method for forming the wiring layer include CVD, ALD, and PVD.

Etching of the wiring layer can be performed using, for example, a hard mask pattern obtained by transferring a resist pattern as a mask. Dry etching of the wiring layer can be performed using, for example, an oxygen gas, a chlorine gas, or the like as an etching gas.

(Contact and Via Forming Step)

The method of the present embodiment may include an Si-based insulating film dry-etching step for forming a contact hole or a via prior to the cleaning step. The Si-based insulating film is composed of a film containing Si, such as a $SiO_2$, SiOC, SiC, or SiN film. In addition, the etch stop layer including SiN, SiCN, SiCO, $Al_2O_3$, or the like may be formed under the Si-based insulating film that forms a contact or a via. After performing the dry etching, a wiring using molybdenum or tungsten is exposed at a bottom of the contact or the via. Examples of a method for forming the wiring layer include CVD, ALD, and PVD.

In addition to the steps, the method of the present embodiment may include a hard mask removing step, a dielectric layer forming step, a polishing step, an etch stop layer forming step, and the like after the cleaning step.

According to the method of the present embodiment, the substrate is cleaned using the cleaning liquid according to the first aspect. Thus, in the substrate where at least one metal selected from the group consisting of molybdenum and tungsten is exposed on the surface, a silicon-containing etching residue and the like can be cleaned while not damaging the metal. As a result, the method of the present embodiment can be suitably applied to a substrate after performing a dry etching of a layer containing molybdenum or tungsten (for example, a tungsten wiring layer and a molybdenum wiring layer) by a wiring process.

EXAMPLES

Hereinafter, the present invention will be described in more detail with reference to Examples, but the present invention is not limited to these examples.

Components used in Examples or Comparative Examples are shown below. Furthermore, 0.1 M aqueous solutions of the components (B1), (B2), and (B3) were prepared, and values of pH's thereof as measured at 23° C. using a pH meter (a portable pH meter D-73S, Horiba, Ltd.) are also written.

<Hydrazine Compound (A)>

(A)-1: Hydrazinoethanol.

(A)-2: Hydrazine monohydrate.

(A)-3: t-Butylhydrazine hydrochloride.

(A)-1

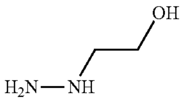

(A)-2

$H_2N—NH_2 \cdot H_2O$ (A)-3

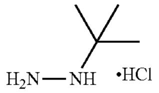

<Quaternary Hydroxide (B1)>

(B1)-1: Tetraethylammonium hydroxide (TEAH). pH: 13

(B1)-2: Tetramethylammonium hydroxide (TMAH). pH: 13

(B1)-3: Tris(2-hydroxyethyl)methylammonium hydroxide (THEMAH). pH: 12

(B1)-4: Choline. pH: 13

(B1)-5: Tetrabutylphosphonium hydroxide. pH: 13

(B1)-1

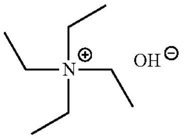

-continued (B1)-2

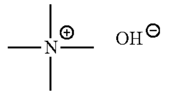

(B1)-3

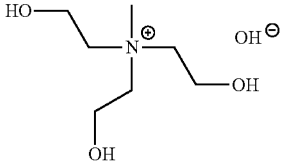

(B1)-4

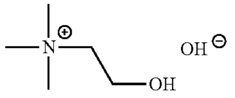

(B1)-5

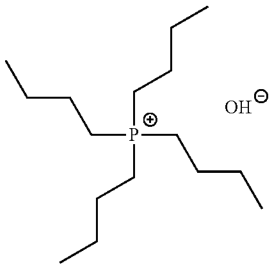

<Amine (B2)>

(B2)-1: 2-(2-Aminoethylamino)ethanol (AEEA). pH: 11

(B2)-1

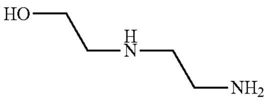

<Amine (B3)>

(B3)-1: Butylamine. pH: 13

(B3)-2: Diethylamine. pH: 13

(B3)-3: Triethylamine. pH: 13

(B3)-4: 1-Amino-2-propanol. pH: 11

<Organic Solvent (S)>

(S)-1: Propylene glycol.

(S)-2: N-Methylmorpholine N-oxide.

(S)-3: N-Methylpyrrolidone.

(S)-4: Sulfolane.

<Preparation of Cleaning Liquid>

Examples 1 to 24 and Comparative Examples 1 to 14

Each component shown in Tables 1 to 13 was used to prepare a cleaning liquid of each Example. In Tables 1 to 13, each abbreviation has the meaning above. The numbers in brackets [ ] show % by mass with respect to the total mass of the cleaning liquid. In Tables 1 to 13, DIW means ultrapure water, and the pH is a pH of the cleaning liquid measured at 23° C. with a pH meter, except for Comparative Examples 13 and 14.

[Evaluation of Etching Rate]

A substrate obtained by forming a molybdenum film (50 nm), a tungsten film (100 nm), or an amorphous silicon film (100 nm) by PVD on a 12-inch silicon substrate was used as the substrate. The substrate was cut into 2 cm×2 cm to manufacture a wafer coupon. A200 mL beaker was filled with 100 mL of the cleaning liquid of each Example and heated to 60° C., and the wafer coupon was immersed in the cleaning liquid. Stirring was performed at 60° C. and 300 rpm during immersion of the wafer coupon. After performing the immersion for 10 minutes, the wafer coupon was taken out from the cleaning liquid, cleaned with water at room temperature for 30 seconds, and dried by blowing nitrogen.

The film thicknesses of the wafer coupon before and after immersion in the cleaning liquid were measured. The film thicknesses of the wafer coupons having the molybdenum film and the tungsten film were measured using an X-ray fluorescence spectrometer (ZSX Primus IV, Rigaku Corporation). The film thickness of the wafer coupon having an amorphous silicon film was measured using an ellipsometer (M-2000, J. A. Woollam Co.). The etching rate was calculated from changes in film thickness of the molybdenum film, the tungsten film, and the amorphous silicon film before and after the cleaning treatment. In the tables, Mo represents molybdenum, W represents tungsten, and aSi represents amorphous silicon. In Tables 1 to 12, one Comparative Example and one Example corresponding to the Comparative Example in terms of the composition are described in one table, and the results of evaluating the etching rates according to the following evaluation standard are described. In Table 13, the values of the etching rates are described.

[Evaluation Standard for Molybdenum or Tungsten]

A: Suppressed by 30% or more from the etching rate of the corresponding Comparative Example B: Suppressed by 10% or more from the etching rate of the corresponding Comparative Example C: Suppressed by less than 10% or deteriorated by less than 10% from the etching rate of the corresponding Comparative Example D: Deteriorated by 10% or more from the etching rate of the corresponding Comparative Example

[Evaluation Standard for Amorphous Silicon]

A: Increased by 30% or more from the etching rate of the corresponding Comparative Example B: Increased by 10% or more from the etching rate of the corresponding Comparative Example C: Increased by less than 10% or deteriorated by less than 10% from the etching rate of the corresponding Comparative Example D: Reduced by 10% or more from the etching rate of the corresponding Comparative Example

TABLE 1

| | (A) Component | (B) Component | (S) Component | DIW | pH | Mo, W | aSi |
|---|---|---|---|---|---|---|---|
| Comparative Example 1 | — | (B1)-1 [1.44] | — | Balance | 13 | — | — |
| Example 1 | (A)-1 [0.0025] | (B1)-1 [1.44] | — | Balance | 13 | A | A |
| Example 2 | (A)-1 [0.005] | (B1)-1 [1.44] | — | Balance | 13 | A | A |
| Example 3 | (A)-1 [0.01] | (B1)-1 [1.44] | — | Balance | 13 | A | A |
| Example 4 | (A)-1 [0.02] | (B1)-1 [1.44] | — | Balance | 13 | A | A |
| Example 5 | (A)-1 [0.1] | (B1)-1 [1.44] | — | Balance | 13 | A | A |

TABLE 1-continued

| | (A) Component | (B) Component | (S) Component | DIW | pH | Mo, W | aSi |
|---|---|---|---|---|---|---|---|
| Example 6 | (A)-2 [0.02] | (B1)-1 [1.44] | — | Balance | 13 | A | A |
| Example 7 | (A)-3 [0.02] | (B1)-1 [1.44] | — | Balance | 13 | A | A |
| Example 8 | (A)-1 [0.02] | (B1)-1 [1.44] | (S)-1 [10] | Balance | 13 | A | A |
| Example 9 | (A)-1 [0.02] | (B1)-1 [1.44] | (S)-2 [10] | Balance | 13 | A | A |

TABLE 2

| | (A) Component | (B) Component | DIW | pH | Mo, W | aSi |
|---|---|---|---|---|---|---|
| Comparative Example 2 | — | (B1)-1 [0.0001] | Balance | 7 | — | — |
| Example 10 | (A)-1 [0.02] | (B1)-1 [0.0001] | Balance | 9.5 | B | B |

TABLE 3

| | (A) Component | (B) Component | DIW | pH | Mo, W | aSi |
|---|---|---|---|---|---|---|
| Comparative Example 3 | — | (B1)-1 [0.001] | Balance | 9.5 | — | — |
| Example 11 | (A)-1 [0.02] | (B1)-1 [0.001] | Balance | 10 | B | B |

TABLE 4

| | (A) Component | (B) Component | DIW | pH | Mo, W | aSi |
|---|---|---|---|---|---|---|
| Comparative Example 4 | — | (B1)-1 [0.01] | Balance | 11 | — | — |
| Example 12 | (A)-1 [0.02] | (B1)-1 [0.01] | Balance | 11 | B | B |

TABLE 5

| | (A) Component | (B) Component | DIW | pH | Mo, W | aSi |
|---|---|---|---|---|---|---|
| Comparative Example 5 | — | (B1)-2 [0.91] | Balance | 13 | — | — |
| Example 13 | (A)-1 [0.02] | (B1)-2 [0.91] | Balance | 13 | A | A |
| Example 14 | (A)-1 [0.1] | (B1)-2 [0.91] | Balance | 13 | A | A |
| Example 15 | (A)-2 [0.02] | (B1)-2 [0.91] | Balance | 13 | A | A |
| Example 16 | (A)-2 [0.1] | (B1)-2 [0.91] | Balance | 13 | A | A |

TABLE 6

| | (A) Component | (B) Component | DIW | pH | Mo, W | aSi |
|---|---|---|---|---|---|---|
| Comparative Example 6 | — | (B1)-3 [1.81] | Balance | 12 | — | — |
| Example 17 | (A)-2 [0.02] | (B1)-3 [1.81] | Balance | 13 | A | A |

TABLE 6-continued

| | (A) Component | (B) Component | DIW | pH | Mo, W | aSi |
|---|---|---|---|---|---|---|
| Example 18 | (A)-1 [0.02] | (B1)-3 [1.81] | Balance | 13 | A | A |

TABLE 7

| | (A) Component | (B) Component | DIW | pH | Mo, W | aSi |
|---|---|---|---|---|---|---|
| Comparative Example 7 | — | (B1)-4 [1.21] | Balance | 13 | — | — |
| Example 19 | (A)-1 [0.1] | (B1)-4 [1.21] | Balance | 13 | A | B |

TABLE 8

| | (A) Component | (B) Component | DIW | pH | Mo, W | aSi |
|---|---|---|---|---|---|---|
| Comparative Example 8 | — | (B2)-1 [1.04] | Balance | 11 | — | — |
| Example 20 | (A)-1 [0.02] | (B2)-1 [1.04] | Balance | 11 | A | A |

TABLE 9

| | (A) Component | (B) Component | DIW | pH | Mo, W | aSi |
|---|---|---|---|---|---|---|
| Comparative Example 9 | — | (B1)-5 [2.76] | Balance | 13 | — | — |
| Example 21 | (A)-1 [0.02] | (B1)-5 [2.76] | Balance | 13 | B | B |

TABLE 10

| | (A) Component | (B) Component | DIW | pH | Mo, W | aSi |
|---|---|---|---|---|---|---|
| Comparative Example 10 | — | (B3)-1 [0.73] | Balance | 13 | — | — |
| Example 22 | (A)-1 [0.02] | (B3)-1 [0.73] | Balance | 13 | B | B |

TABLE 11

| | (A) Component | (B) Component | DIW | pH | Mo, W | aSi |
|---|---|---|---|---|---|---|
| Comparative Example 11 | — | (B3)-2 [0.73] | Balance | 13 | — | — |
| Example 23 | (A)-1 [0.02] | (B3)-2 [0.73] | Balance | 13 | B | B |

TABLE 12

| | (A) Component | (B) Component | DIW | pH | Mo, W | aSi |
|---|---|---|---|---|---|---|
| Comparative Example 12 | — | (B3)-3 [1.01] | Balance | 13 | — | — |
| Example 24 | (A)-1 [0.02 | (B3)-3 [1.01] | Balance | 13 | B | B |

TABLE 13

| | (A) Component | (B) Component | (S) Component | DIW | pH | Mo, W (nm/min) | aSi |
|---|---|---|---|---|---|---|---|
| Comparative Example 13 | (A)-1 [1.00] | (B3)-4 [10.0] | (S)-3 [60.0] (S)-4 [30.0] | None | Alkaline | 0.1, 0.2 | <0.1 |
| Comparative Example 14 | (A)-2 [1.00] | (B3)-4 [10.0] | (S)-3 [60.0] (S)-4 [30.0] | None | Alkaline | 0.1, 0.2 | <0.1 |

From the results in Tables 1 to 12, it was confirmed that the cleaning liquids of Examples 1 to 24 can suppress the etching rates of molybdenum and tungsten, and increase the etching rate for amorphous silicon, as compared with the cleaning liquids of the corresponding Comparative Examples. From these results, it was considered that the cleaning liquids of Examples 1 to 24 can suppress a damage to the molybdenum wiring and the tungsten wiring, and have good cleanability for silicon-containing residues. On the other hand, it was considered that in the cleaning liquids of Comparative Examples 1 to 12, the etching rates for either or both of molybdenum and tungsten are high, the etching rate for amorphous silicon is low, and a reduction in a damage to the molybdenum wiring and the tungsten wiring and cleanability cannot be compatibly attained. In Comparative Examples 13 and 14, it was considered that the amorphous silicon cannot be etched and cannot be used as a cleaning liquid.

While preferred embodiments of the invention have been described and illustrated above, it should be understood that these are exemplary examples of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

EXPLANATION OF REFERENCES

1: substrate
10: wiring layer
20: hard mask layer
30: Low-k layer
40: residue

What is claimed is:

1. A cleaning liquid for cleaning a substrate wherein at least one metal selected from the group consisting of molybdenum and tungsten is exposed on a surface, the cleaning liquid comprising:

at least one hydrazine compound (A) selected from the group consisting of a compound represented by General Formula (a1), a hydrate of the compound, and a salt of the compound;

a water-soluble basic compound (B) with a pH of 9.5 or more in a 0.1 M aqueous solution, which is measured at 23° C. with a pH meter; and water, provided that the cleaning liquid contains no hydroxylamine, (a1)

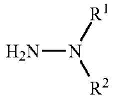

wherein $R^1$ and $R^2$ each independently represents an organic group comprising no carbonyl group or a hydrogen atom, wherein a pH of the cleaning liquid is 11 to 13.5, which is measured at 23° C. with a pH meter, the amount of the at least one hydrazine compound (A) is 0.001% by mass or more and 0.05% by mass or less, with respect to the total mass of the cleaning liquid, the amount of the water-soluble basic compound (B) is 0.0001% by mass or more and 20% by mass or less, with respect to the total mass of the cleaning liquid, and the amount of water is 80% by mass or more, with respect to the total mass of the cleaning liquid.

2. The cleaning liquid according to claim 1, wherein the amount of the hydrazine compound (A) is 0.002% by mass or more and 0.05% by mass or less with respect to a total mass of the cleaning liquid.

3. The cleaning liquid according to claim 1, further comprising at least one selected from the group consisting of a buffer, an anticorrosive agent, a surfactant, and an organic solvent.

4. The cleaning liquid according to claim 1, wherein the cleaning liquid is used to clean the substrate after performing a dry etching of a layer containing the metal.

5. The cleaning liquid according to claim 1, wherein the compound (B) is selected from the group consisting of:

(B1) a quaternary hydroxide represented by General Formula (b1):

(b1)

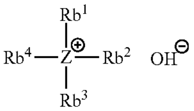

wherein $Rb^1$ to $Rb^4$ each independently represents a hydrocarbon group which may have a substituent; and Z represents a phosphorus atom; and (B2) an amine other than the hydrazine compound (A) and hydroxylamine, selected from the group consisting of a primary monoamine other than hydroxylamine, a secondary monoamine not comprising a ring structure, and a tertiary monoamine not comprising a ring structure.

6. A method for cleaning a substrate, comprising contacting the substrate with the cleaning liquid according to claim 1.

7. The method for cleaning a substrate according to claim 6, wherein the substrate is a substrate after performing a dry etching of a layer containing the metal.

8. The method for cleaning a substrate according to claim 6, wherein the substrate is a substrate after performing chemical-mechanical polishing of a layer containing the metal.

* * * * *